United States Patent
Ito et al.

(10) Patent No.: US 7,358,035 B2
(45) Date of Patent: Apr. 15, 2008

(54) TOPCOAT COMPOSITIONS AND METHODS OF USE THEREOF

(75) Inventors: Hiroshi Ito, San Jose, CA (US); Linda Karin Sundberg, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/159,946

(22) Filed: Jun. 23, 2005

(65) Prior Publication Data

US 2006/0292485 A1    Dec. 28, 2006

(51) Int. Cl.
*G03F 7/095* (2006.01)
*G03F 7/20* (2006.01)
*G03F 7/30* (2006.01)
*G03F 7/11* (2006.01)

(52) U.S. Cl. .................. 430/311; 430/273.1; 430/326; 430/396

(58) Field of Classification Search ...................... None
See application file for complete search history.

(56) References Cited

U.S. PATENT DOCUMENTS

| | | | |
|---|---|---|---|
| 3,402,087 A * | 9/1968 | Yackel et al. ............... | 156/246 |
| 3,992,208 A | 11/1976 | Nagata et al. | |
| 4,792,507 A | 12/1988 | Yoshihara et al. | |
| 5,130,224 A * | 7/1992 | Kawabe et al. ............. | 430/191 |
| 5,554,486 A * | 9/1996 | Garza ....................... | 430/273.1 |
| 5,750,312 A * | 5/1998 | Chandross et al. ....... | 430/273.1 |
| 5,939,236 A * | 8/1999 | Pavelchek et al. ........ | 430/273.1 |
| 6,566,021 B2 | 5/2003 | Wang | |
| 6,767,587 B1 | 7/2004 | Brown | |

(Continued)

FOREIGN PATENT DOCUMENTS

EP            244567 A2 *   11/1987

(Continued)

OTHER PUBLICATIONS

Yamashita et al , "Synthesis of fluorinated materials for 193 nm immersion lithography and 157 nm lithography", Proceedings of SPIE—vol. 5753, Sturtevant, editor, May 2005, pp. 564-571.*

(Continued)

*Primary Examiner*—Cynthia Hamilton
(74) *Attorney, Agent, or Firm*—Schmeiser, Olsen & Watts; Daniel E. Johnson

(57) ABSTRACT

A topcoat composition that includes a fluorine-containing polymer and a casting solvent selected from the group consisting of α,α,α-trifluorotoluene, 2,2,3,3,4,4,5,5-octafluoropentyl-1,1,2,2-tetrafluoroethyl ether (OFP-TFEE), and a mixture consisting of a hydrophobic alkane and an alcohol is provided. Also provided is method of forming an image on a photoresist that includes forming a photoresist over a substrate; applying a topcoat composition, the topcoat composition comprising at least one fluorine-containing polymer and a casting solvent, onto the photoresist; removing the casting solvent of the topcoat composition resulting in the formation of a topcoat material over the photoresist; exposing the photoresist to radiation, the radiation changing a chemical composition of the regions of the photoresist exposed to the radiation, forming exposed and unexposed regions in the photoresist; and removing i) the topcoat material and ii) the exposed regions of the photoresist or the unexposed regions of the photoresist.

17 Claims, 14 Drawing Sheets

U.S. PATENT DOCUMENTS

| | | |
|---|---|---|
| 6,800,418 B2 | 10/2004 | Yoon et al. |
| 6,806,026 B2 | 10/2004 | Allen et al. |
| 6,835,524 B2 | 12/2004 | Hatakeyama et al. |
| 6,875,552 B2 * | 4/2005 | Hishiro .................. 430/270.1 |
| 7,160,665 B2 * | 1/2007 | Larson et al. ............... 430/202 |
| 2002/0102490 A1 | 8/2002 | Ito et al. |
| 2002/0146638 A1 | 10/2002 | Ito et al. |
| 2003/0003393 A1 * | 1/2003 | Yamaguchi et al. ..... 430/270.1 |
| 2003/0022073 A1 | 1/2003 | Wang |
| 2003/0036016 A1 * | 2/2003 | Szmanda et al. ........ 430/270.1 |
| 2003/0157430 A1 | 8/2003 | Yoon et al. |
| 2003/0165769 A1 * | 9/2003 | Prat et al. .................. 430/175 |
| 2003/0228537 A1 | 12/2003 | Yoon et al. |
| 2004/0170919 A1 | 9/2004 | Kim et al. |
| 2004/0225159 A1 | 11/2004 | Komoriya et al. |
| 2005/0202347 A1 * | 9/2005 | Houlihan et al. ........... 430/311 |
| 2005/0250898 A1 * | 11/2005 | Maeda et al. ............... 524/544 |
| 2005/0286031 A1 * | 12/2005 | French et al. ................ 355/30 |
| 2006/0188804 A1 * | 8/2006 | Allen et al. .............. 430/270.1 |

FOREIGN PATENT DOCUMENTS

WO     WO-00/67072 A   *   11/2000

OTHER PUBLICATIONS

Petrillo et al Journal of Vacuum Science & Technology B: Microelectronics and Nanometer Structures—Nov. 1998—vol. 16, Issue 6, pp. 3709-3715.*

Ito, et al., Fluoropolymer Resists: Fundamentals and Lithographic Evaluation; Journal of Photopolymer Science and Technology; vol. 17, No. 4 (2004); pp. 6009-620.

* cited by examiner

TOPCOAT COMPOSITIONS AND METHODS OF USE THEREOF

FIELD OF THE INVENTION

The present invention relates to the field of photolithography; more specifically, it relates to a topcoat composition and methods of use thereof in photolithographic imaging.

BACKGROUND OF THE INVENTION

Immersion photolithography at 193 nanometers (nm) is considered to be the most viable next generation technology for semiconductor device fabrication. Immersion photolithography provides high resolution and depth of focus of photolithographic images. Water is placed in a space between a lens and a photoresist layer. In this configuration, however, the water could degrade the photoresist performance by diffusing into the photoresist layer and extracting photoresist components such as an acid generator, a base quencher and other key components.

Topcoat materials are applied to photoresist layers via casting solvents and removed during development by a developing solvent. As with the use of water above, certain casting solvents degrade the photoresist performance by extracting or removing key photoresist components. Therefore, a need exists for a topcoat material and a method of use thereof that overcomes at least one of the aforementioned deficiencies.

SUMMARY OF THE INVENTION

A first aspect of the present invention is a topcoat composition comprising: at least one fluorine-containing polymer represented by the formula (1), (2), (3), or (4):

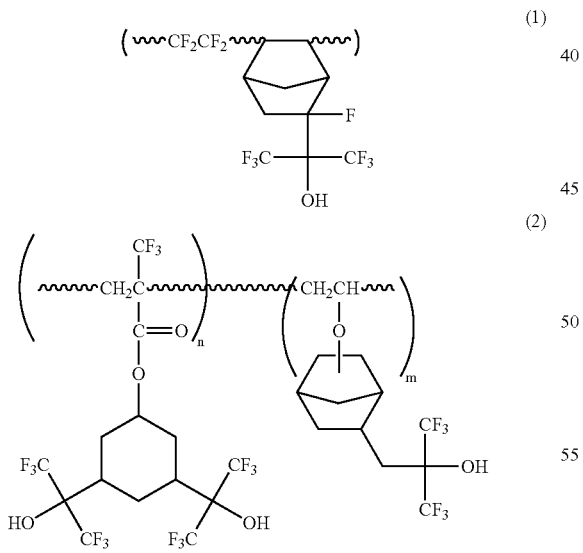

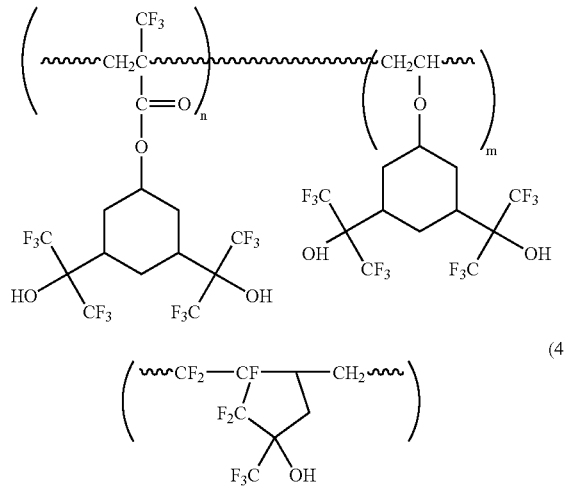

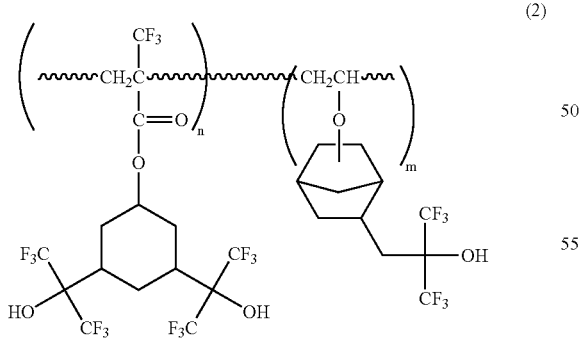

wherein n and m represent respective molar fractions such that n+m=1; and a casting solvent selected from the group consisting of α,α,α-trifluorotoluene, 2,2,3,3,4,4,5,5-octafluoropentyl-1,1,2,2-tetrafluoroethyl ether (OFP-TFEE), a mixture consisting of a hydrophobic alkane and an alcohol, and combinations thereof.

A second aspect of the present invention a method of forming an image on a photoresist comprising: forming a photoresist over a substrate; applying a topcoat composition, said topcoat composition comprising at least one fluorine-containing polymer represented by the formula (1), (2), (3), or (4):

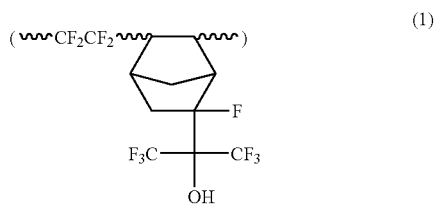

-continued

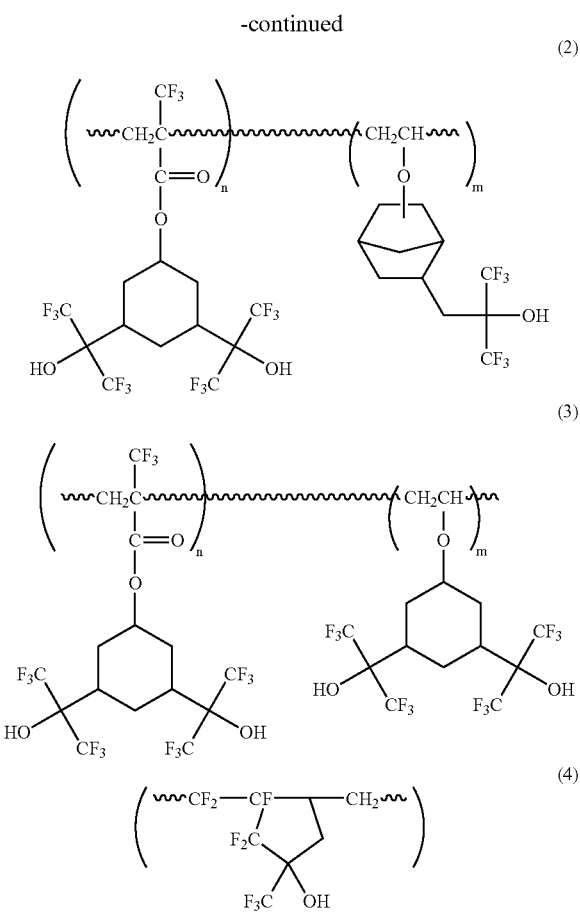

wherein n and m represent respective molar fractions such that n+m=1, and a casting solvent, onto said photoresist; removing said casting solvent of said topcoat composition resulting in the formation of a topcoat material over said photoresist; exposing said photoresist to radiation, said radiation changing a chemical composition of said regions of said photoresist exposed to said radiation, forming exposed and unexposed regions in said photoresist; and removing i) said topcoat material and ii) said exposed regions of said photoresist or said unexposed regions of said photoresist.

A third aspect of the present invention a method comprising: applying a substantially non-polar solvent with a base-soluble material dispersed therein over a photoresist; removing said substantially non-polar solvent resulting in the formation of a topcoat over said photoresist; exposing at least a portion of the photoresist to imaging radiation to form a latent image therein; and removing the topcoat material.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
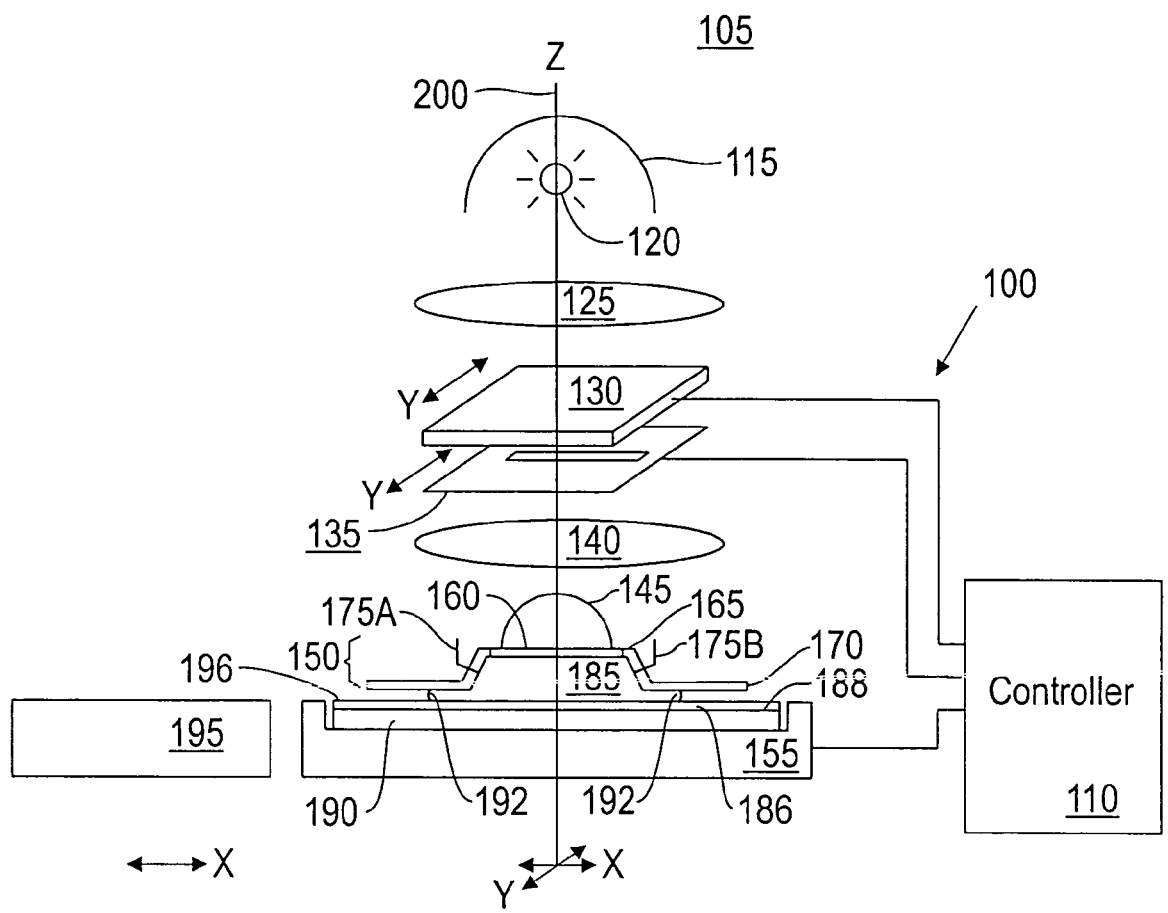
FIG. 1 depicts a diagram of an immersion photolithographic system that may be used to process a semiconductor wafer with a topcoat, in accordance with the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of an embodiment. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

SYNTHESIS EXAMPLES

The fluorine-containing polymer represented by formula (1) is commercially available from Daikin, Inc.

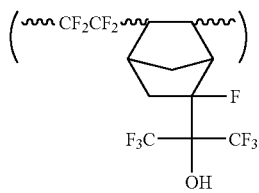
(1)

and was used as received. The polymer (4) was commercially available from Asahi Glass, Inc. and was used as received.

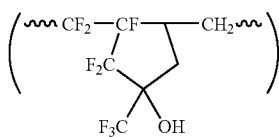
(4)

BHFACHTFMA (3,5-bis(hexafluoro-2-hydroxy-2-propyl)cyclohexyl 2-trifluoromethylacrylate) was obtained from Central Glass, Inc. and was used as received. BHFACHVE (3,5-bis(hexafluoro-2-hydroxy-2-propyl)cyclohexyl vinyl ether) was obtained from Central Glass, Inc. and was used as received.

VENBHFA(5-[(1',1',1'-trifluoro-2'-trifluoromethyl-2'-hydroxy)propyl]norboman-2-yl vinyl ether) was synthesized prior to its use per the following procedure. To a 3-necked 500-mL round-bottomed flask equipped with a condenser (nitrogen inlet), a digital thermometer, and a magnetic stir bar was added 173.2 g (0.63 mol) of NBHFA and 100 g (1.9 mol) of formic acid (88%). The mixture was heated at 100° C. under nitrogen overnight. The resulting yellow solution was evaporated on a rotary evaporator leaving a thick yellow oil to which was added 120 mL of concentrated ammonium hydroxide (28%).

The mixture then was heated with stirring at 60° C. overnight. After cooling, the layers were separated and the lower layer was diluted with 500 mL of diethyl ether and washed sequentially with 5% (v/v) HCl (2×250 mL), water (2×200 mL), and brine. The ether solution was dried over $MgSO_4$, and evaporated and distilled at 92° C. at 0.8 mm Hg to yield 156 g (84%) of 2-hydroxy-5-[(1',1',1'-trifluoro-2'-trifluoromethyl-2'-hydroxy)propyl]norbomane as a clear, colorless oil.

To a 1-L 3-necked round-bottomed flask equipped with a nitrogen inlet, digital thermometer and magnetic stir bar were added 100 g (0.34 mol) of the 2-hydroxy-5-[(1',1',1'-trifluoro-2'-trifluoromethyl-2'-hydroxy)propyl]norbornane, 400 g (5.5 mol) of ethyl vinyl ether, and 3.2 g (0.01 mol) of mercuric acetate. The solution was stirred at room temperature for 2 days. The resulting mixture was evaporated on a rotary evaporator, diluted with 500 mL of diethyl ether, and washed sequentially with saturated sodium bicarbonate, water and brine.

After stirring over anhydrous magnesium sulfate overnight, the suspension was filtered, the solvent removed on a rotary evaporator, and the resulting oil distilled twice from solid sodium bicarbonate at 96° C. at 0.5 mmHg. The best fractions were pooled to yield 54 g (50%) of the VENBHFA as a clear, colorless oil.

EXAMPLE 1

Synthesis of the Polymer (2)

The polymer (2) was prepared from the polymerization of 3,5-bis(hexafluoro-2-hydroxy-2-propyl)cyclohexyl 2-trifluoromethylacrylate (BHFACHTFMA) with VENBHFA per the following procedure.

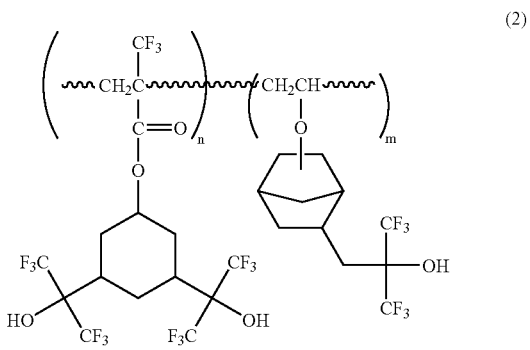
(2)

BHFACHTFMA (2.7744 g) and VENBHFA (1.6003 g) were dissolved in 2.0565 g of ethyl acetate, to which was added 0.0658 g of 2,2'-azobis-(isobutyronitrile) AIBN. The solution was deaerated by bubbling $N_2$ for 30 mm and then heated at 60° C. for 24 hrs.

After cooling to room temperature, the mixture was diluted with acetone and poured into hexane with stirring. The solvent was decanted and the remaining solid was dissolved in acetone. The polymer was reprecipitated in hexane. After decanting the solvent, the solid polymer was dried at room temperature under vacuum overnight. The product was the polymer (2) having a composition of acrylate/vinyl ether with n=0.61 and m=0.39. The weight-average molecular weight was 9,090 g/mol.

EXAMPLE 2

Synthesis of the Polymer (3)

The polymer (3) was prepared from the polymerization of BHFACHTFMA with BHFACHVE per the following procedure.

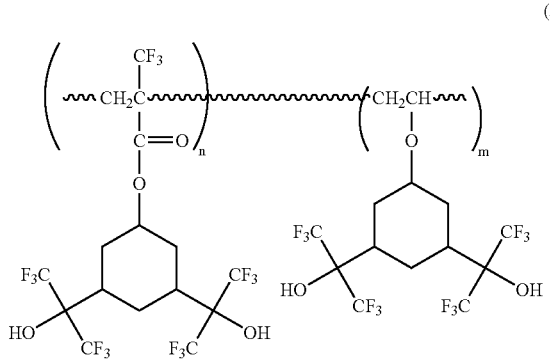

(3)

BHFACHTFMA (5.5519 g) and 0.1315 g of AIBN were added to 9.3694 g of 50% solution of BHFACHVE in EtOAc. After deaeration by bubbling $N_2$ for 30 min, the mixture was heated at 60° C. for 24 hrs. The mixture was cooled to room temperature and diluted with acetone. The polymer was precipitated in hexane and the solvent decanted. The solid polymer was dissolved in acetone and reprecipitated in hexane. The precipitated polymer was filtered, washed with hexane, and dried at 50° C. in a vacuum oven overnight. The product was the polymer (3) having a composition of acrylate/vinyl with n=0.57 and m=0.43. The weight-average molecular weight was 66,200 g/mol.

Experimental

The polymers (1), (2), (3), and (4) typically have a weight-average molecular weight in a range from about 3,000 g/mol to about 100,000 g/mol as used in an embodiment of the present invention. Referring to the fluorine-containing polymers (2), (3), and (4), wherein n and m represent respective molar fractions such that n+m=1 and wherein n is in a range from about 50 mole percent (mol. %) to about 75 mol. % and m is in a range from about 50 mol. % to about 25 mol. %. Further n is greater than m.

The fluorine-containing polymer (1) is soluble in solvents advantageously such as α,α,α-trifluorotoluene, 2,2,3,3,4,4, 5,5-octafluoropentyl-1,1,2,2-tetrafluoroethyl ether, an aqueous base, and a mixture of decane-octanol (from about 75% to about 95% decane and from about 25% to about 5% octanol). The fluorine-containing polymer (2) is soluble in α,α,α-trifluorotoluene, and an aqueous base. Polymers (3) and (4) are soluble in a mixture of decane-octanol (from about 75% to about 95% decane and from about 25% to about 5% octanol). Decane is a hydrophobic alkane and octanol is a slightly polar alcohol. A mixture of the two in about a 90% to 10% ratio, respectively, provides a mixture/solvent that is substantially non-polar in accordance with the present invention.

Examples of the aqueous base include but are not limited to tetramethylammonium hydroxide (TMAH), an alkylammonium hydroxide, an arylammonium hydroxide, a Group (I) hydroxide, a Group (I) carbonate, and the like. Examples of the Group (I) hydroxide include but are not limited to LiOH, NaOH, KOH, and the like. Examples of the Group (I) carbonate include but are not limited to $Li_2CO_3$, $Na_2CO_3$, $K_2CO_3$, and the like.

The use of the aforementioned aqueous bases is not meant to limit the type of aqueous bases that may be used to dissolve the polymers (1), (2), (3), and (4) in an embodiment of the present invention. Other aqueous bases that are capable of dissolving the polymers (1), (2), (3), or (4), and compatible with the photolithographic system and the photoresists used (see FIG. 1 and description provided infra) may be used in accordance with the present invention.

A casting solvent is a solvent used to dissolve a polymer therein. The casting solvent with the dissolved polymer is then evenly spread or cast onto a substrate for use in photolithographic image processing. Casting solvents typically used for the polymers (1), (2), (3), and (4) include α,α,α-trifluorotoluene, 2,2,3,3,4,4,5,5-octafluoropentyl-1,1, 2,2-tetrafluoroethyl ether (OFP-TFEE), a mixture of decane-octanol (90% to 10% by weight respectively) and the like.

A first topcoat composition comprising a fluorine-containing polymer represented by formula (1) and a,a,-trifluorotoluene is formulated by dissolving the polymer (1) in α,α,α-trifluorotoluene ) (1 weight % to 10 weight % respectively). For example, adding 1 gram (g) of the fluorine-containing polymer (1) to 10 g of α,α,α-trifluorotoluene and stirring gives one topcoat composition in an embodiment of the present invention. The amount of polymer (1) typically used in the topcoat composition may be in a range from about 1 g to 5 g and can be scaled up to a range from about 100 g to over 1 kilogram (kg). The amount of polymer (1) used is only dependent on the amount needed to form the first topcoat composition. Similarly, a second topcoat composition comprising the polymer (1) and OFP-TFEE may be formulated, as described above for the polymer (1) in α,α,α-trifluorotoluene, in an embodiment of the present invention.

A second topcoat composition comprising the polymer represented by formula (2) and α,α,α-trifluorotoluene is formulated by dissolving the polymer (2) in α,α,α-trifluorotoluene (1 weight % to 10 weight % respectively). For example, adding 1 gram (g) of the polymer (2) to 10 g of α,α,α-trifluorotoluene and stirring gives the third topcoat composition in an embodiment of the present invention. The amount of polymer (2) typically used in the topcoat composition may be in a range from about 1 g to 5 g and can be scaled up to a range from about 100 g to over 1 kilogram (kg). The amount of polymer (2) used is only dependent on the amount needed to form the third topcoat composition in an embodiment of the present invention.

A third topcoat composition comprising the polymer (3) and a mixture of decane-octanol, 1% polymer (3) to 10% mixture, is formulated by dissolving the polymer (3) in the decane-octanol mixture (from about 75% to about 95% decane and from about 25% to about 5% octanol). For example, adding 1 gram (g) of the polymer (3) to 10 g of a decane-octanol mixture and stirring glves the fourth topcoat composltlon ln an embodiment of the present invention. The amount of polymer (3) typically used in the topcoat composition may be in a range from about 1g to 5 g and can be scaled up to a range from about 100 g to over 1 kilogram (kg). The amount of polymer (3) used is only dependent on the amount needed to form the fourth topcoat composition in an embodiment of the present invention.

A fourth topcoat composition comprising the polymer (4) and a mixture of decane-octanol, 1% polymer (4) to 10% mixture, is formulated by dissolving the polymer (4) in the decane-octanol mixture (from about 75% to about 95% decane and from about 25% to about 5% octanol). For example, adding 1 gram (g) of the polymer (4) to 10 g of decane-octanol and stirring gives the fifth topcoat composition in an embodiment of the present invention. The amount of polymer (4) typically used in the topcoat composition may be in a range from about 1 g to 5 g and can be scaled up to a range from about 100 g to over 1 kilogram (kg). The amount of polymer (4) used is only dependent on the amount needed to form the fifth topcoat composition in an embodiment of the present invention.

Polymer concentrations of the polymers (1)-(4) in the casting solvents described above can range from about 30% by weight to about 1% by weight depending on the molecular weight of the polymers (1)-(4) and the thickness of the final topcoat material desired. A typical concentration of thin (30 nm-40 nm) topcoat materials range from about 1% by weight to about 3% by weight. The topcoat material thickness can vary from about 20 nm to about 3000 nm.

FIG. 1 depicts a diagram of an immersion photolithographic system that may be used to process a semiconductor wafer with a topcoat composition in an embodiment of the present invention. Referring to FIG. 1, an immersion lithography system 100 includes a controlled environment chamber 105 and a controller 110. Contained within the environment chamber 105 is a focusing mirror 115, a light source 120, a first focusing lens (or set of lenses) 125, a mask 130, an exposure slit 135, a second focusing lens (or set of lenses) 140, a final focusing lens 145, an immersion head 150, and a wafer chuck 155.

The immersion head 150 includes a transparent window 160, a central chamber portion 165, a surrounding plate portion 170, an immersion fluid inlet 175A and an immersion fluid outlet 175B. An immersion fluid 185 fills the central chamber portion 165 and contacts a photoresist layer 186 on a top surface 188 of a wafer 190. The photoresist layer 186 includes a topcoat 196 formed from a topcoat composition, described supra, in an embodiment of the present invention. In one example, the immersion fluid 185 is water. The plate portion 170 is positioned close enough to the photoresist layer 186 to form a meniscus 192 under the plate portion 170. The window 160 is transparent to the wavelength of light selected to expose the photoresist layer 186.

The focusing mirror 115, the light source 120, the first focusing lens 125, a mask 130, the exposure slit 135, the second focusing lens 140, the final focusing lens 145, the immersion head 150 are all aligned along an optical axis 200 which also defines a Z direction. An X direction is defined as a direction orthogonal to the Z direction and in the plane of the drawing. A Y direction is defined as a direction orthogonal to both the X and Z directions.

The wafer chuck 155 may be moved in the X and Y directions under the direction of the controller 110 to allow formation of exposed regions and unexposed regions of the photoresist in the photoresist layer 186. As an XY-stage moves, new portions of photoresist layer 186 are brought into contact with the immersion fluid 185 and previously immersed portions of the photoresist layer 186 are removed from contact with the immersion fluid 185. The mask 130 and the slit 135 may be moved in the Y direction under the control of the controller 110 to scan the image (not shown) on the mask 130 onto the photoresist layer 186. In one example, the image on the mask 130 is a 1× to a 10× magnification version of the image to be printed and includes one or multiple integrated circuit chip images.

When exposure is complete, the wafer 190 is removed from the controlled environment chamber 105 without spilling the immersion fluid 185. To this end, the controlled environment chamber 105 also includes a cover plate 195 that may be moved to first abut with the wafer chuck 155 and then move with the wafer chuck 155 as the wafer chuck 155 is moved out of position from under the immersion head 150 with the cover plate replacing the wafer chuck 155 under the immersion head 150.

The immersion photolithographic system described above is not meant to limit the types of photolithographic systems that may be used in accordance with the present invention. Other systems such as air (dry) photolithographic systems and maskless interferometric lithography systems are compatible with the compositions and methods of the present invention. For example, maskless systems do not use a photomask when exposing the photoresist to radiation. The radiation still changes the chemical composition of the regions of the photoresist exposed to the radiation, forming exposed and unexposed regions in the photoresist. Further, radiation sources capable of producing photolithographic images are also compatible with the compositions and methods of the present invention. For example, electron beam radiation.

A method of forming an image on a photoresist is presented in accordance with the present invention. A 193 nanometer (nm) single layer photoresist was formed on three substrates (silicon (Si) wafers). All the Si wafers employed in the experiments were coated with a bottom anti-reflection coating prior to applying the photoresist layer. The photoresist layer was spin coat applied onto the Si wafers and followed with a post photoresist apply bake. The post photoresist apply bake is also known as a pre-exposure bake or pre-bake, and is performed to remove the photoresist solvent. Topcoat compositions comprising the fluorine-containing polymer (1) and (2), as described supra, were cast, i.e. applied, onto two of the Si wafers having the photoresist layer. Both topcoat compositions were prepared as previously described.

The topcoat compositions were spin coat applied onto the photoresist layer of the two Si wafers at a baking temperature of 100° C. and 1,500 rotations per minute (rpm) for 30 seconds. During the baking process the casting solvent is evaporated from the topcoat composition resulting in the formation of a topcoat material over the photoresist layer. The entire Si wafer having the single layer photoresist and topcoat material is referred to as a stack. The topcoat compositions may be applied onto the single layer photoresist using alternative methods such as spraying, dip coating, and the like.

The two stacks then were exposed to 193 nm radiation through the photomask of the immersion photolithographic system process described supra and depicted in FIG. 1. The photomask has regions that are opaque and transparent to the radiation. Irradiation or me photoresist layer through the photomask produces exposed and unexposed regions of the photoresist layer. The exposed regions of the photoresist layer have a change in the chemical composition due to the radiation.

The stacks then were post expose baked at 110° C. for 90 sec. and were developed with 0.26 normal (N) TMAH for 60 sec. The TMAH developer removed the topcoat material and selectively removed either the exposed region or the unexposed region of the photoresist layer to produce an image on the Si wafer. The third stack comprising of a Si wafer and a single layer photoresist only also was exposed to 193 nm radiation, post expose baked at 110° C. for 90 sec, and developed with 0.26 N TMAH for 60 sec. also producing an image on the Si wafer.

The use of an aqueous base such as TMAH in the developing stage is to remove the topcoat material and selectively either the exposed region or the unexposed region of the photoresist layer from the Si wafer. Other aqueous bases that may be used include but are not limited to an alkylammonium hydroxide, an arylammonium hydroxide, a Group (I) hydroxide, a Group (I) carbonate, and the like. Examples of the Group (I) hydroxide include but are not limited to LiOH, NaOH, KOH, and the like. Examples of the Group (I) carbonate include but are not limited to $Li_2CO_3$, $Na_2CO_3$, $K_2CO_3$, and the like.

Figure 2:
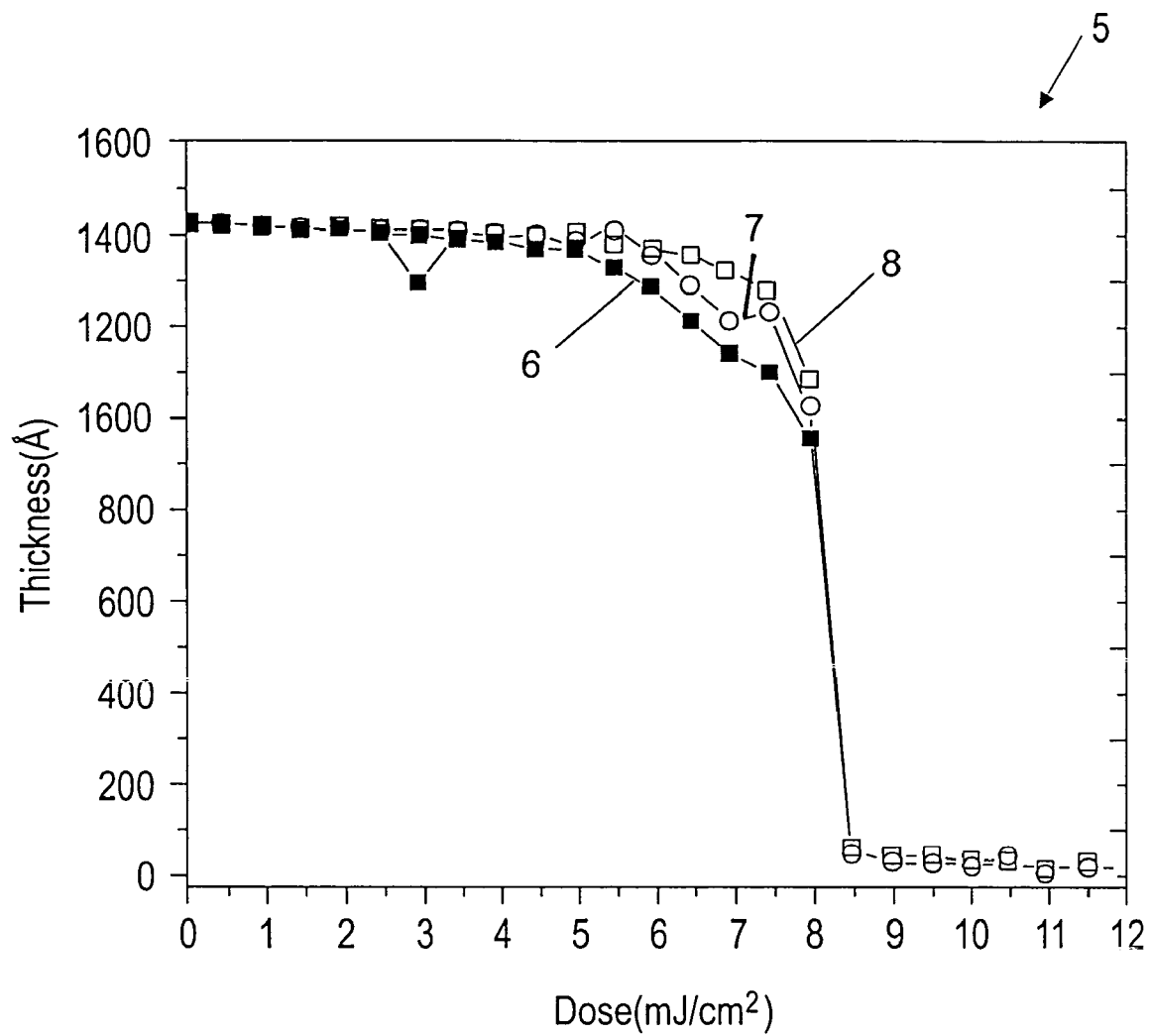
FIG. 2 depicts a plot of contrast curves of a photoresist layer without a topcoat material, and with two different topcoat materials cast from α,α,α-trifluorotoluene, in accordance with the present invention.

During the photolithographic imaging process described above, the change in thickness of the photoresist layers of the three wafers was measured as a function of irradiation dosage. FIG. 2 depicts a plot 5 of contrast curves of a photoresist layer without a topcoat material and with two different topcoat materials cast from α,α,α-trifluorotoluene in an embodiment of the present invention.

Referring to FIG. 2, the plot 5 is of photoresist layer thickness in angstroms (Å) versus radiation dose in milli-Joules/centimeter ($mJ/cm^2$). Contrast curve 6 is the photoresist layer without the topcoat composition that was irradiated and developed with TMAH. Contrast curve 7 is the photoresist layer with the topcoat material cast from α,α,α-trifluorotoluene having the polymer (1) therein with subsequent irradiation and development. Contrast curve 8 is the photoresist layer with the topcoat material cast from α,α,α-trifluorotoluene having the polymer (2) therein with subsequent irradiation and development.

Examination of the plot 5 demonstrates the viability of the topcoat compositions described above and the resultant topcoat materials for use in the immersion photolithography process. Contrast curves 7 and 8, with the topcoat material, varied little from the contrast curve 6, without the topcoat material, after irradiation and development. Contrast curves 6, 7, and 8 are nearly identical indicating the absence of any significant interference of the topcoat material with the exposure of the photoresist to the radiation and the development step of the photolithography process.

Figure 3A:
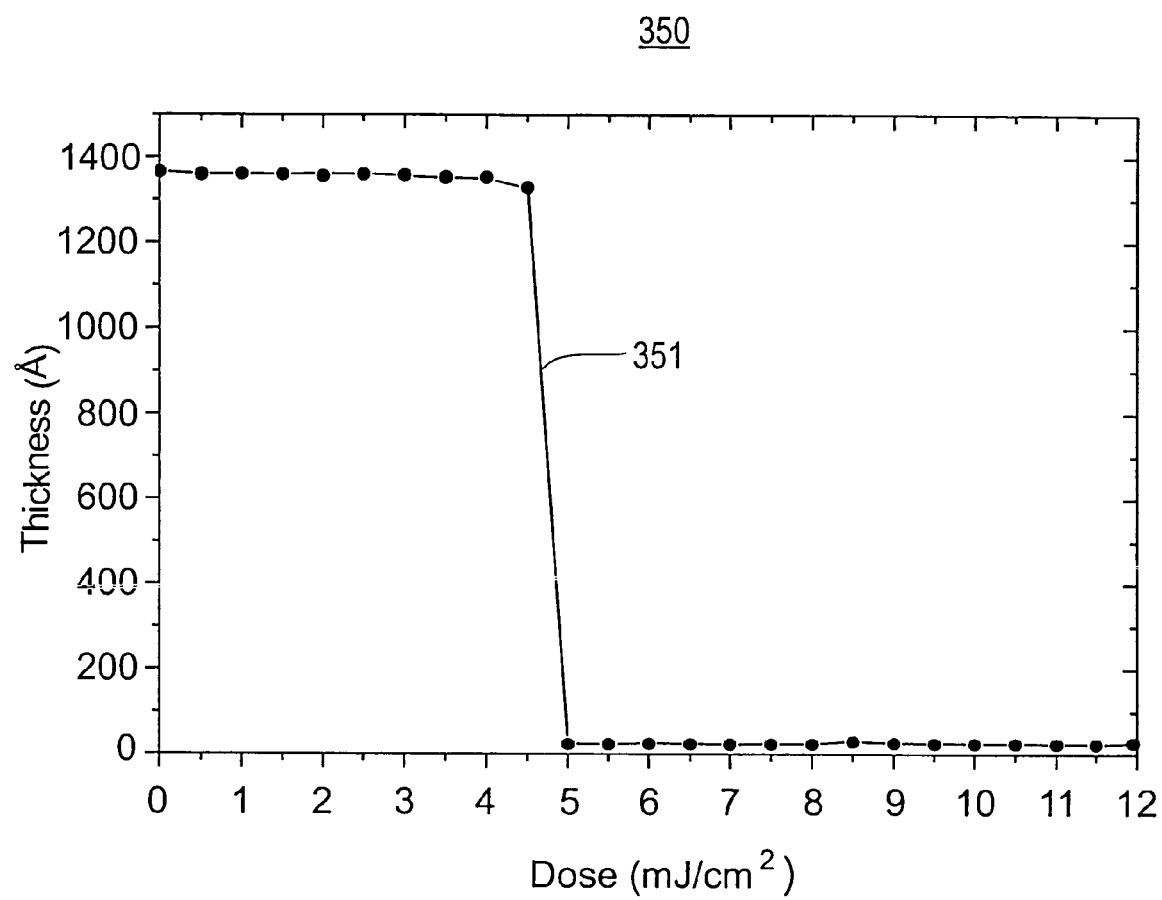
FIG. 3A depicts a plot of contrast curves of a bilayer photoresist without a topcoat composition on a silicon (Si) wafer exposed to radiation and subsequent development, in accordance with the present invention.
Figure 3B:
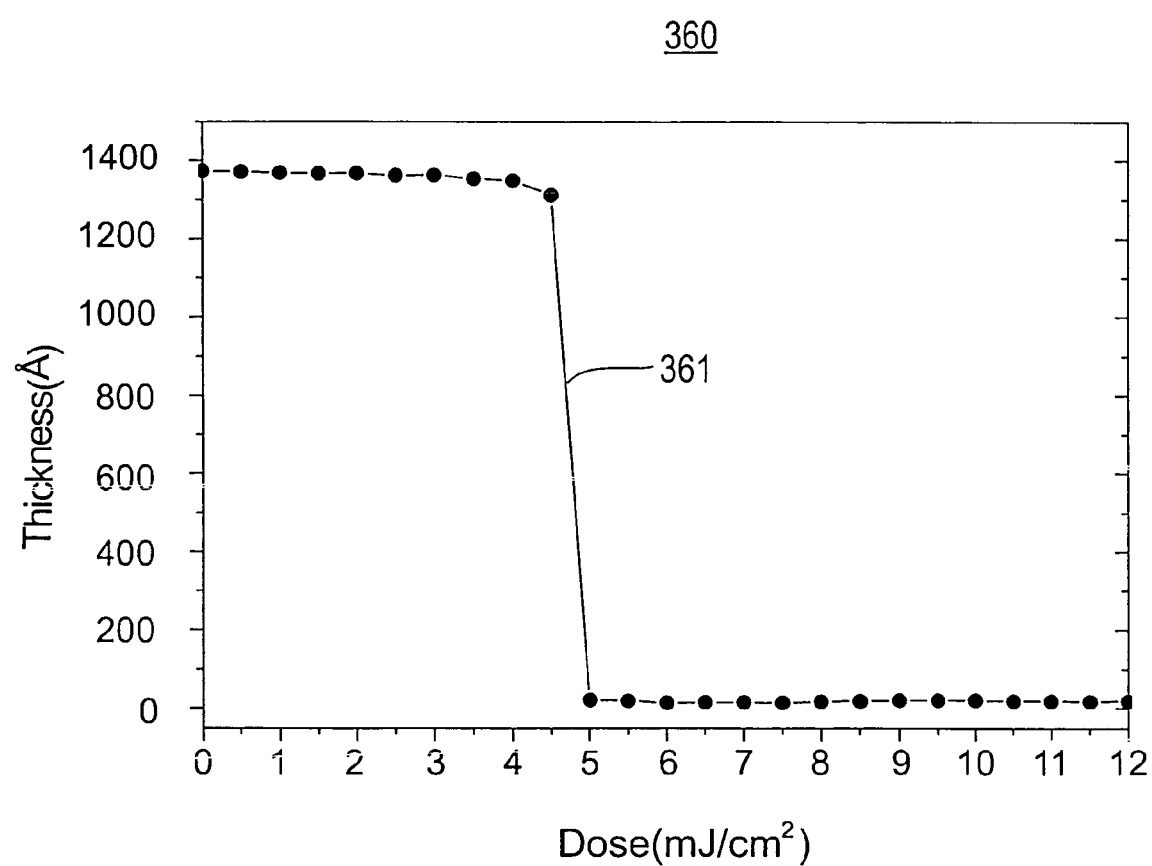
FIG. 3B depicts a plot of contrast curves of a bilayer photoresist without a topcoat material on a Si wafer exposed to the casting solvent α, α, α,-trifluorotoluene prior to irradiation and subsequent development, in accordance with the present invention.

While the topcoat compositions and topcoat materials in an embodiment of the present invention, as described above, were used in context with a single layer photoresist, they also have utility in the photolithography process with bilayer photoresists. FIG. 3A depicts a plot 350 of a contrast curve of a bilayer photoresist without a topcoat material on a Si wafer exposed to radiation with subsequent development. The plot 350 is of photoresist layer thickness in Å versus radiation dosage in $mJ/cm^2$. Contrast curve 351 is of the bilayer photoresist without a topcoat material that was irradiated and developed with TMAH. FIG. 3B depicts a plot 360 of a contrast curve of the bilayer photoresist without a topcoat material on a Si wafer exposed to the casting solvent α,α,α-trifluorotoluene prior to irradiation and subsequent development. The plot 360 is of photoresist layer thickness in Å versus radiation dosage in $mJ/cm^2$. Exposure to the casting solvent comprised a rinse of α,α,α-trifluorotoluene over the Si wafers having the bilayer photoresist. Contrast curve 361 is of the bilayer photoresist after post exposure baking.

Referring to FIG. 3A and FIG. 3B, comparison of plots 350 and 360 demonstrate the compatibility of the α,α,α-trifluorotoluene casting solvent for use with the bilayer photoresists in the immersion photolithography process and can be extended to dry photolithography as well. The contrast curve 361 varied little from the contrast curve 351, after the α,α,α-trifluorotoluene rinse, irradiation, and development.

The contrast curves from plots 350 and 360 are nearly identical indicating the absence of any significant photoresist layer degradation during the α,α,α-trifluorotoluene exposure and subsequent development steps during the photolithography process. The data demonstrates that the α,α,α-trifluorotoluene casting solvent can be used to apply the topcoat material on the bilayer photoresist without affecting photoresist performance.

Photoresist layer integrity during topcoat composition application and subsequent photolithographic processing is critical. Significant thinning of the photoresist layer often occurs when the casting solvent of a topcoat composition dissolves portions of the photoresist layer. Great care must be taken in choosing a topcoat composition compatible with the photoresist. The casting solvent of the topcoat composition should be miscible with the topcoat material to allow consistent and uniform application of the topcoat material onto a photoresist layer yet be essentially immiscible with the photoresist layer to prevent thinning or other degradation of the photoresist layer.

Figure 4A:
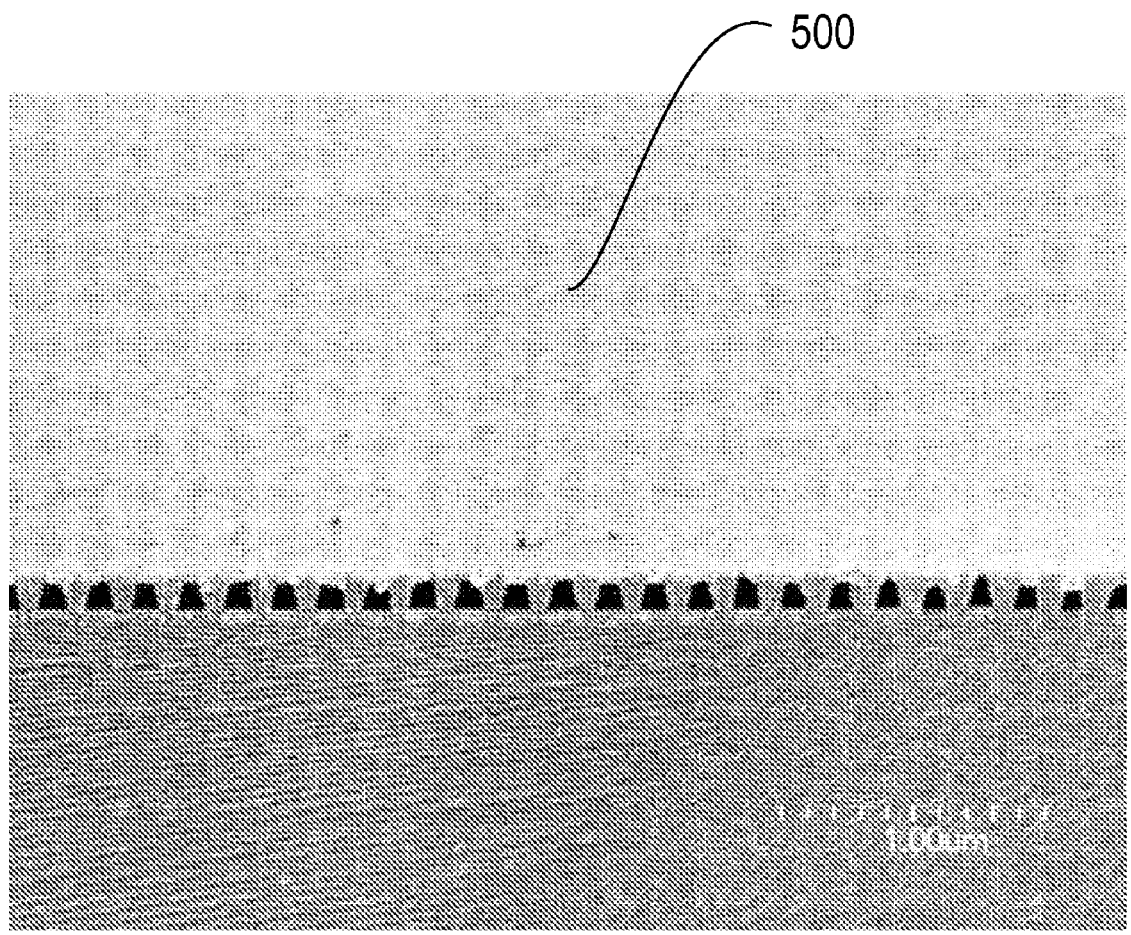
FIG. 4A depicts an electron micrograph of a bilayer photoresist (183 nm pitch) formed by maskiess interferometric water immersion lithography without a topcoat, in accordance with the present invention.

FIG. 4A is an electron micrograph of a bilayer photoresist pattern (183 nm pitch) formed by maskless interferometric water immersion lithography without a topcoat. A 140 nm thick layer of a bilayer photoresist was formed on a 5 inch silicon wafer. The wafer was post apply baked at 120° C. for 60 seconds. The wafer was exposed in water to radiation having a wavelength of 257 nm and then post expose baked at 100° C. for 60 seconds. The wafer was subsequently developed for 60 seconds in 0.26 N TMAH.

Figure 4B:
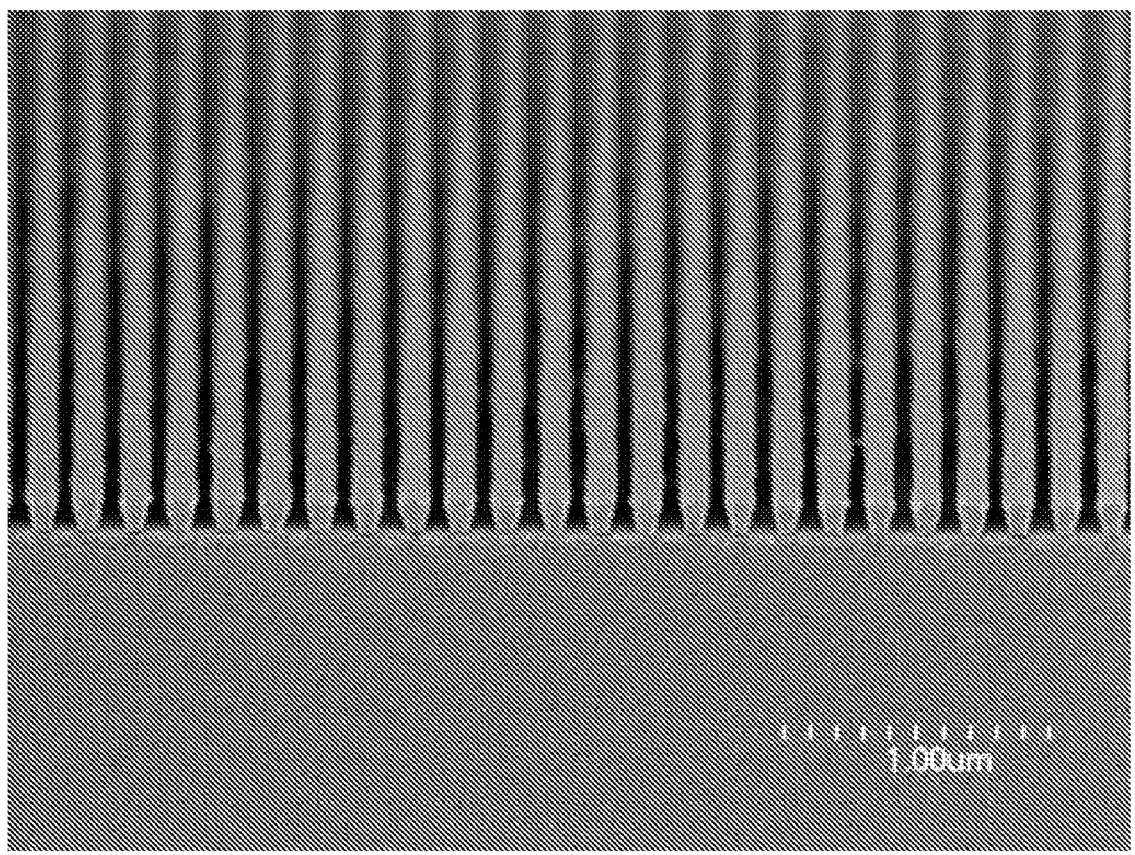
FIG. 4B depicts an electron micrograph of a bilayer photoresist (183 nm pitch) formed by maskless interferometric water immersion lithography with a topcoat material cast from octafluoropentyl-1,1,2,2-tetrafluoroethyl ether (OFP-TFEE), in accordance with the present invention

FIG. 4B is an electron micrograph of a bilayer photoresist pattern (183 nm pitch) formed by maskless interferometric water immersion lithography with a topcoat material cast from 2,2,3,3,4,4,5,5-octafluoropentyl-1,1,2,2-tetrafluoroethyl ether (OFP-TFEE) in an embodiment of the present invention. A 140 nm thick layer of a bilayer photoresist was formed on a 5 inch silicon wafer. The wafer was post apply baked at 120° C. for 60 seconds. A solution of the topcoat composition comprising the polymer (1) in OFP-TFEE was spin cast applied onto the photoresist layer and baked to form the topcoat covering the photoresist layer. The wafer was exposed in water to radiation having a wavelength of 257 nm and then post expose baked at 100° C. for 60 seconds. The wafer was subsequently developed for 60 seconds in 0.26 N TMAH.

Comparing the electron micrograph of FIG. 4A to the electron micrograph of FIG. 4B illustrates that the photoresist image formed from the photoresist layer with a topcoat (FIG. 4B) had no skin 500 present, as seen in FIG. 4A, and had clear 183 mn pitch patterns.

While the topcoat compositions and topcoat materials of the present invention as described above were used in context with water immersion photolithography, they also have utility with dry photolithography.

Figure 5A:
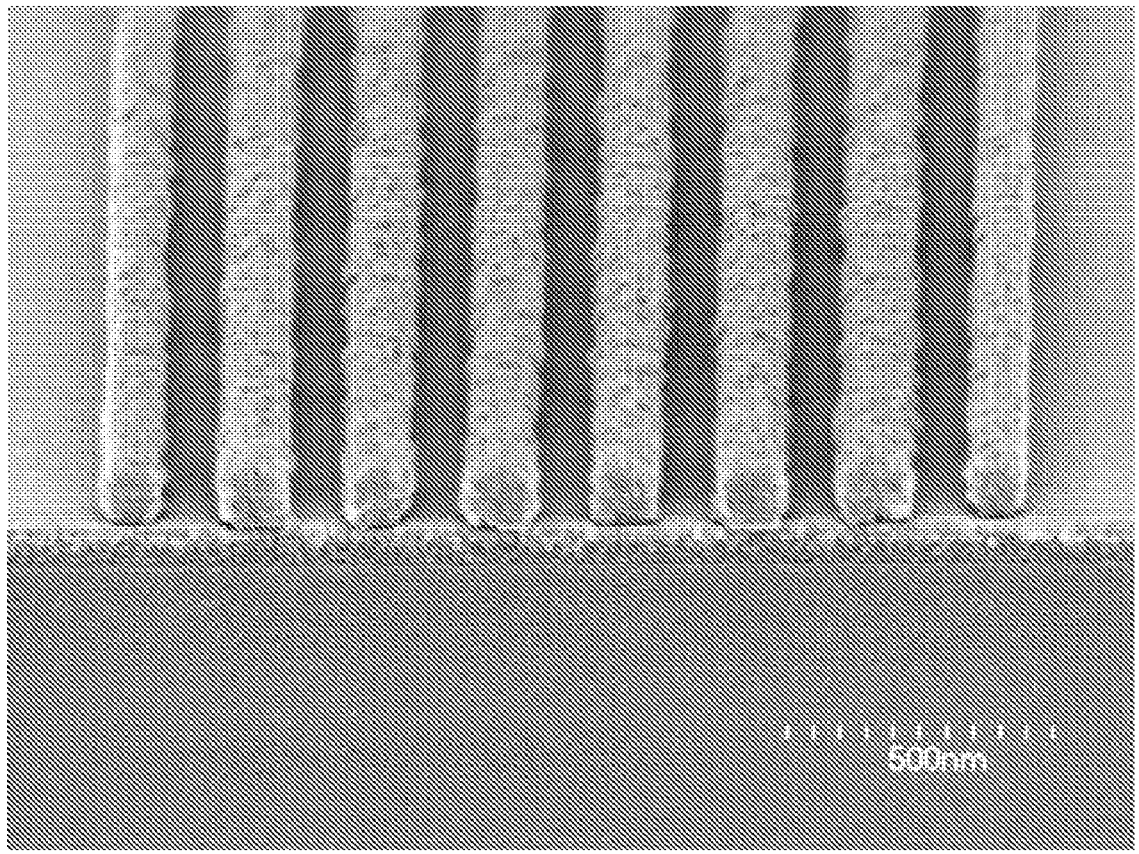
FIG. 5A is an electron micrograph of a single layer photoresist pattern (120 nm lines/spaces) formed in air without a topcoat, in accordance with the present invention.

FIG. 5A is an electron micrograph of a single layer photoresist pattern (120 nm lines/spaces) formed in air (dry photolithography) without a topcoat. A 140 nm thick layer of a commercial 193 nm (exposure wavelength) photoresist was formed on a 5 inch silicon wafer. The wafer was post apply baked at 110° C. for 90 seconds. The wafer was then exposed in air through a 1:1 clear to opaque mask pattern at a wavelength of 193 nm and then post expose baked at 110° C. for 90 seconds. The wafer was subsequently developed for 60 seconds in 0.26 N TMAH.

Figure 5B:
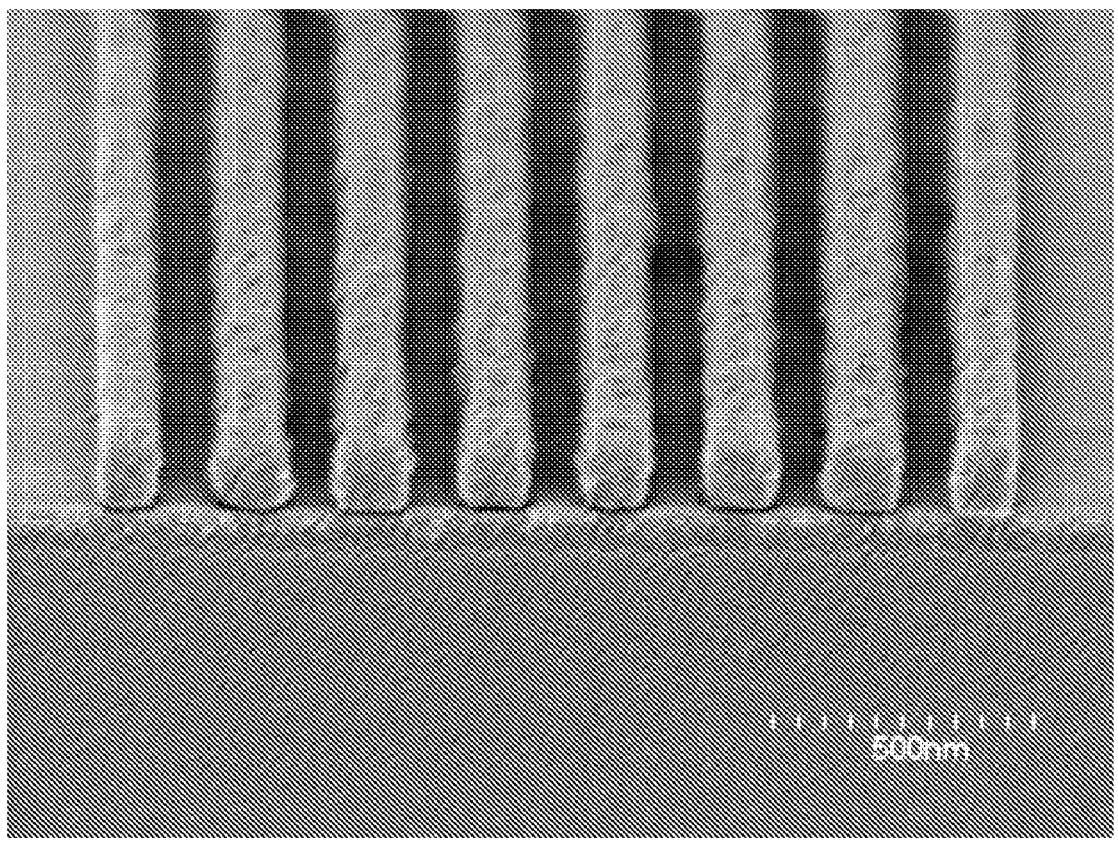
FIG. 5B is an electron micrograph of a single layer photoresist pattern (120 nm lines/spaces) formed in air with a topcoat material cast from α,α,α-trifluorotoluene, in accordance with the present invention.

FIG. 5B is an electron micrograph of a single layer photoresist pattern (120 nm lines/spaces) formed in air (dry lithography) with a topcoat material cast from α,α,α-trifluorotoluene in an embodiment of the present invention. A 140 nm thick layer of a commercial 193 nm (exposure wavelength) photoresist was formed on a 5 inch silicon wafer. The wafer was post apply baked at 110° C. for 90 seconds. A solution of the topcoat composition comprising the polymer (2) in α,α,α-trifluorotoluene was spin cast applied onto the photoresist layer and baked to form the topcoat covering the photoresist layer. The wafer was then exposed in air through a 1:1 clear to opaque mask pattern at a wavelength of 193 nm and then post expose baked at 110° C. for 90 seconds. The wafer was subsequently developed for 60 seconds in 0.26 N TMAH.

Comparing the electron micrograph of FIG. 5A to the electron micrograph of FIG. 5B illustrates that the photoresist image formed from the photoresist layer with a topcoat (FIG. 5B) had a comparable image to the image formed from the photoresist layer without a topcoat (FIG. 5A). No degradation of the photoresist layer with a topcoat in FIG. 5B can be seen. In fact, improved performance can be observed in that the photoresist layer having a topcoat produced an image with a squarer photoresist profile, with less rough edges, and less thickness loss than the image from the photoresist layer without a topcoat material.

The results above are not limited to a single layer photoresist pattern with 120 nm lines/spaces. One would expect the same performance enhancement with no degradation for a single layer photoresist of varying patterns in accordance with the present invention. For example, single layer photoresist patterns having 130 nm lines/space, 140 nm lines/space, and other photoresist patterns are compatible with the compositions and the methods of the present invention.

Figure 6A:
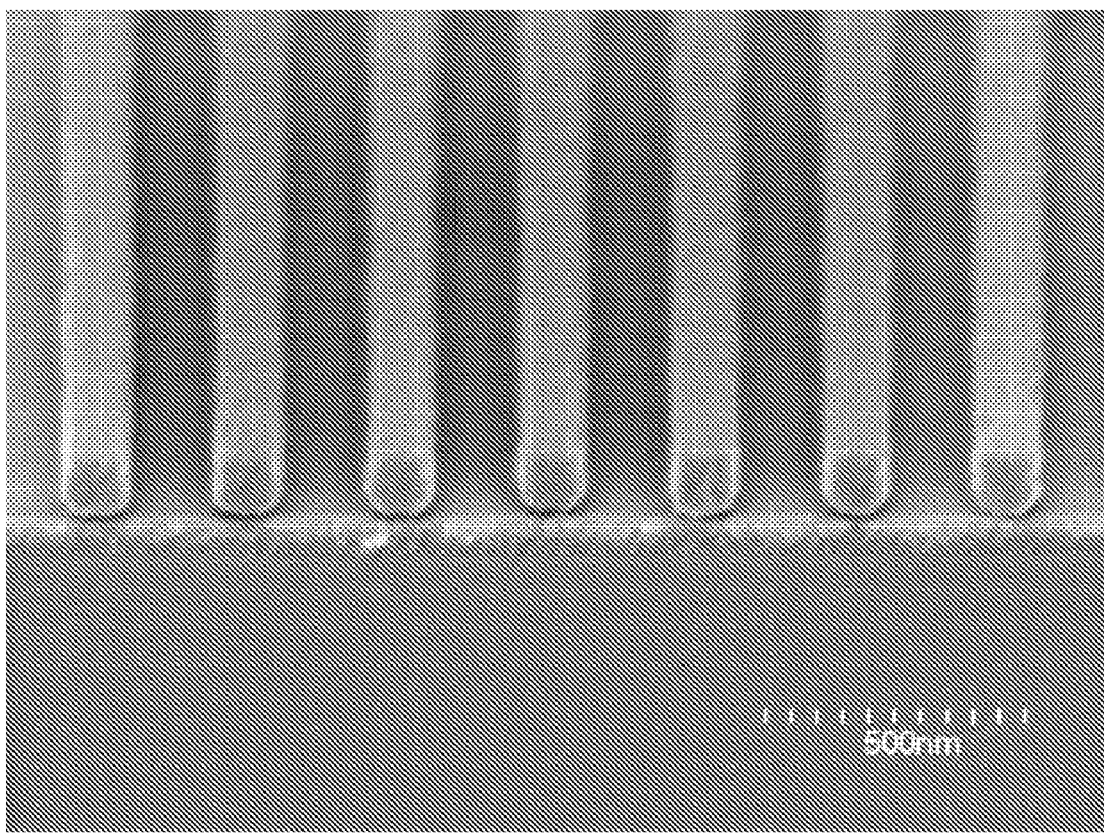
FIG. 6A is an electron micrograph of a bilayer photoresist pattern (120 mn 1:1.5 lines/spaces) formed in air without a topcoat, in accordance with the present invention.

FIG. 6A is an electron micrograph of a bilayer photoresist pattern (120 nm 1:1.5 lines/spaces) formed in air without a topcoat. A 130 nm thick layer of a bilayer 193 nm (exposure wavelength) photoresist was formed on a 5 inch silicon wafer. The wafer was post apply baked at 120° C. for 60 seconds. The wafer was then exposed in air through a 1.5:1 opaque to clear mask pattern at a wavelength of 193 nm and then post expose baked at 100° C. for 60 seconds. The wafer was subsequently developed for 60 seconds in 0.26 N TMAH.

Figure 6B:
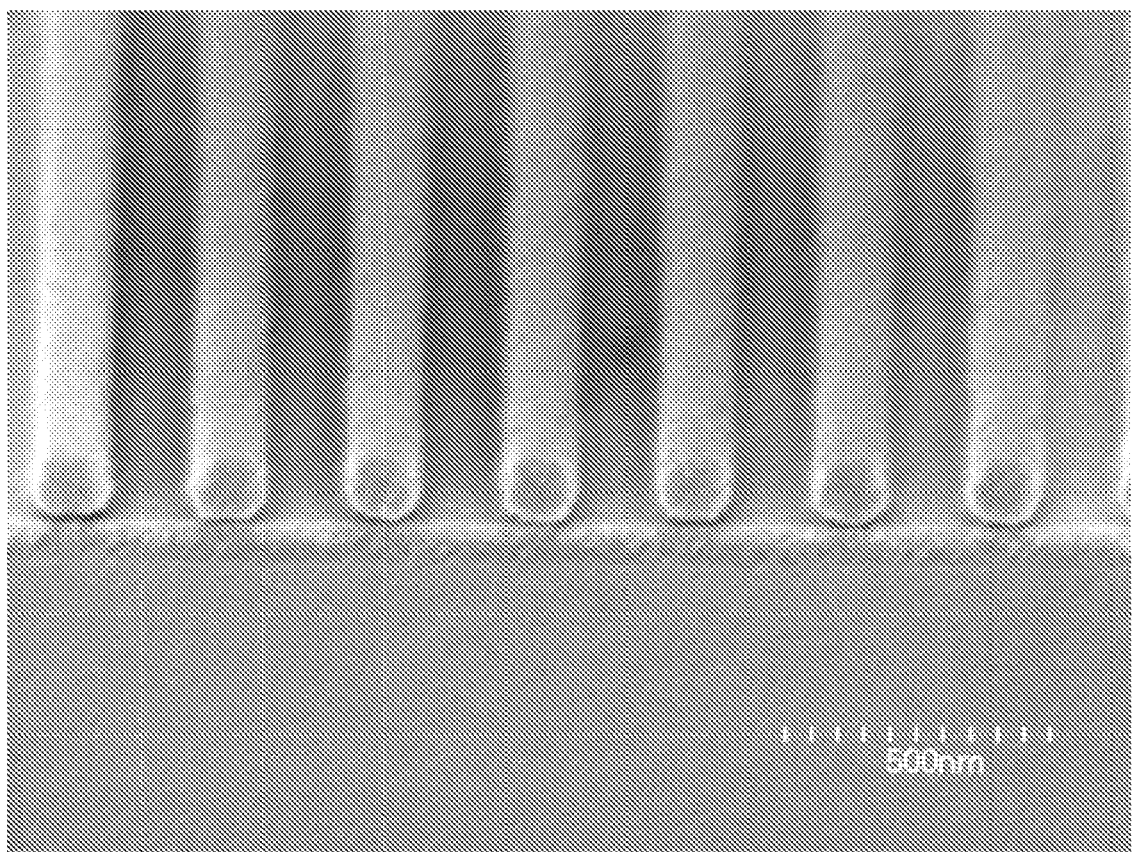
FIG. 6B is an electron micrograph of a bilayer photoresist pattern (120 mn 1:1.5 lines/spaces) formed in air with a topcoat material cast from α,α,α-trifluorotoluene, in accordance with the present invention.

FIG. 6B is an electron micrograph of a bilayer photoresist pattern (120 nm 1:1.5 lines/spaces) formed in air with a topcoat material cast from a,a,a-trifluorotoluene in an embodiment of the present invention. A 130 nm thick layer of a bilayer 193 nm (exposure wavelength) photoresist was formed on a 5 inch silicon wafer. The wafer was post apply baked at 120° C. for 60 seconds. A solution of the topcoat composition comprising the polymer (2) in α,α,α-trifluorotoluene was spin cast applied onto the photoresist layer and baked at 90° C. for 60 sec to form the topcoat covering the photoresist layer. The wafer was then exposed in air through a 1.5:1 opaque to clear mask pattern at a wavelength of 193 nm and then post expose baked at 100° C. for 60 seconds. The wafer was subsequently developed for 60 seconds in 0.26 N TMAH.

Comparing the electron micrograph of FIG. 6A to the electron micrograph of FIG. 6B illustrates that the photoresist image formed from the bilayer photoresist with a topcoat (FIG. 6B) had a comparable image to the image formed from the bilayer photoresist without a topcoat (FIG. 6A). No degradation of the photoresist layer with a topcoat in FIG. 6B can bee seen. In fact, improved performance can be observed in that the photoresist layer having a topcoat produced an image with a squarer photoresist profile, with less rough edges, and less thickness loss than the image from the photoresist layer without a topcoat material.

The results above are not limited to a bilayer photoresist pattern with 120 nm lines/spaces. One would expect the same performance enhancement with no degradation for a bilayer photoresist of varying patterns in accordance with the present invention. For example, bilayer photoresist patterns having 130 nm lines/space, 140 nm lines/space, and other photoresist patterns are compatible with the compositions and the methods of the present invention.

Figure 7A:
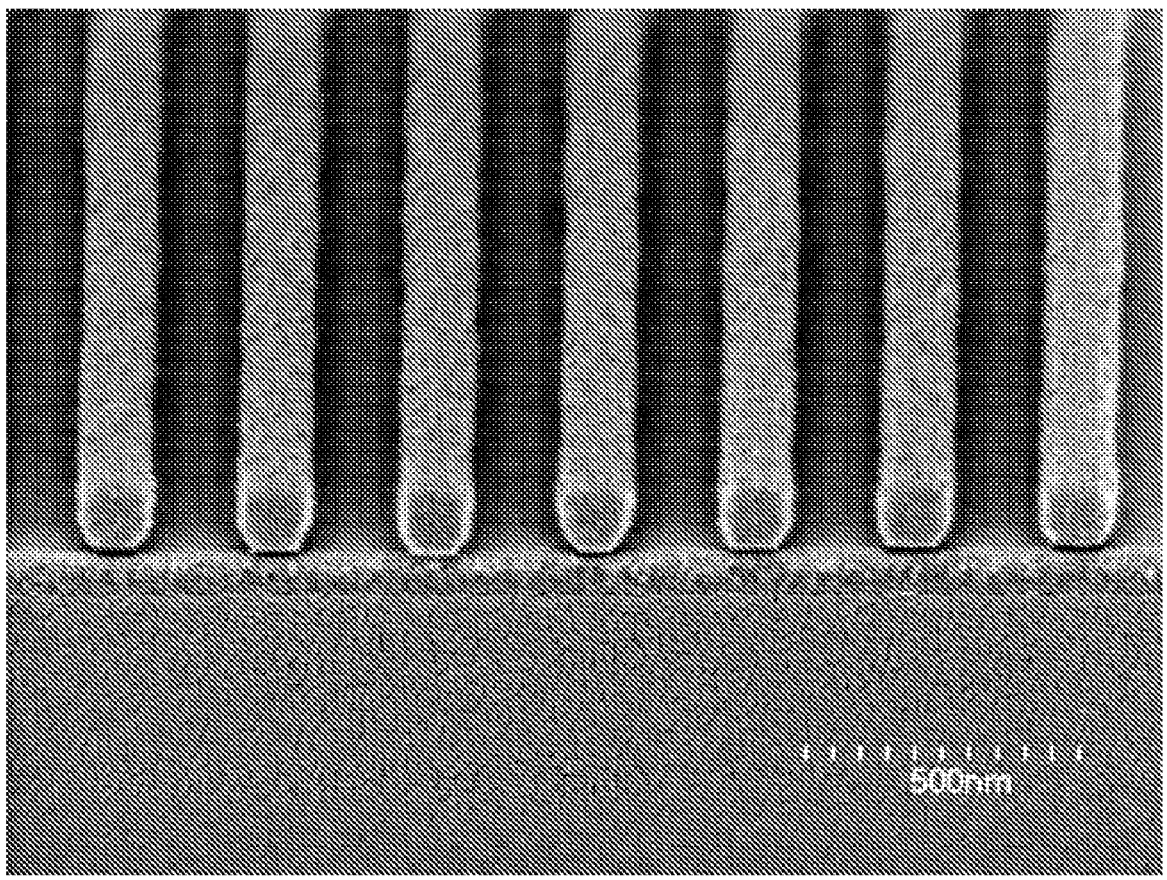
FIG. 7A is an electron micrograph of a bilayer photoresist pattern (120 nm 1:1.5 lines/spaces) formed in air without a topcoat, in accordance with the present invention.

FIG. 7A is an electron micrograph of a bilayer photoresist pattern (120 nm 1:1.5 lines/spaces) formed in air without a topcoat. A 120 nm thick layer of a bilayer 193 nm (exposure wavelength) photoresist was formed on a 5 inch silicon wafer. The wafer was post apply baked at 120° C. for 60 seconds. The wafer was then exposed in air through a 1.5:1 opaque to clear mask pattern at a wavelength of 193 nm and then post expose baked at 100° C. for 60 seconds. The wafer was subsequently developed for 60 seconds in 0.26 N TMAH.

Figure 7B:
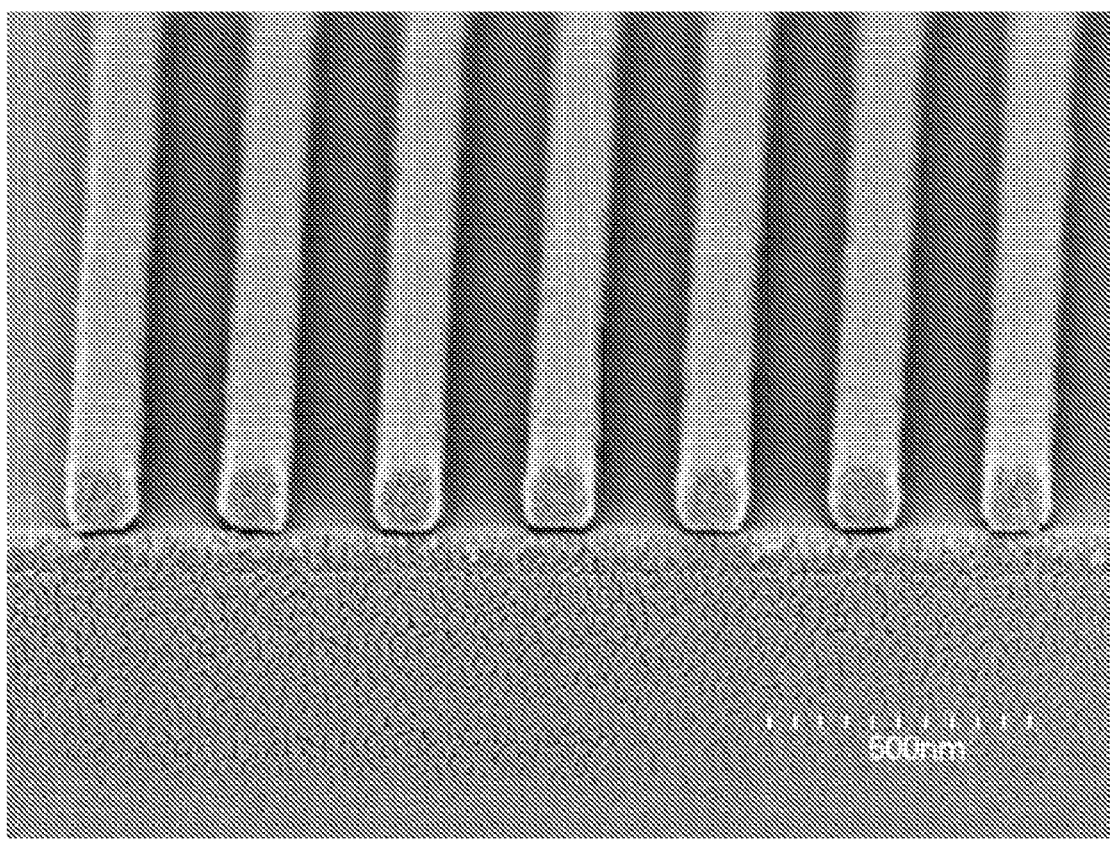
FIG. 7B is an electron micrograph of a bilayer photoresist pattern (120 nm 1:1.5 lines/spaces) formed in air with a topcoat material cast from OFP-TFEE, in accordance with the present invention.

FIG. 7B is an electron micrograph of a bilayer photoresist pattern (120 nm 1:1.5 lines/spaces) formed in air with a topcoat material cast from 2,2,3,3,4,4,5,5-octafluoropentyl-1,1,2,2-tetrafluoroethyl ether (OFP-TFEE) in an embodiment of the present invention. A 130 nm thick layer of a bilayer 193 nm (exposure wavelength) was formed on a 5 inch silicon wafer. The wafer was post apply baked at 120° C. for 60 seconds. A solution of the topcoat composition comprising the polymer (1) in OFP-TFEE was spin cast applied onto the photoresist layer and baked at 90° C. for 60 sec to form a topcoat covering the photoresist layer. The wafer was then exposed in air through a 1.5:1 clear to opaque mask pattern at a wavelength of 193 nm and then post expose baked at 100° C. for 60 seconds. The wafer was subsequently developed for 60 seconds in 0.26 N TMAH developer.

Comparing the electron micrograph of FIG. 7A to the electron micrograph of FIG. 7B illustrates that the photoresist image formed from the bilayer photoresist with a topcoat (FIG. 7B) had a comparable image to the image formed from the bilayer photoresist without a topcoat (FIG. 7A). No degradation of the photoresist layer with a topcoat in FIG. 7B can bee seen.

Figure 8A:
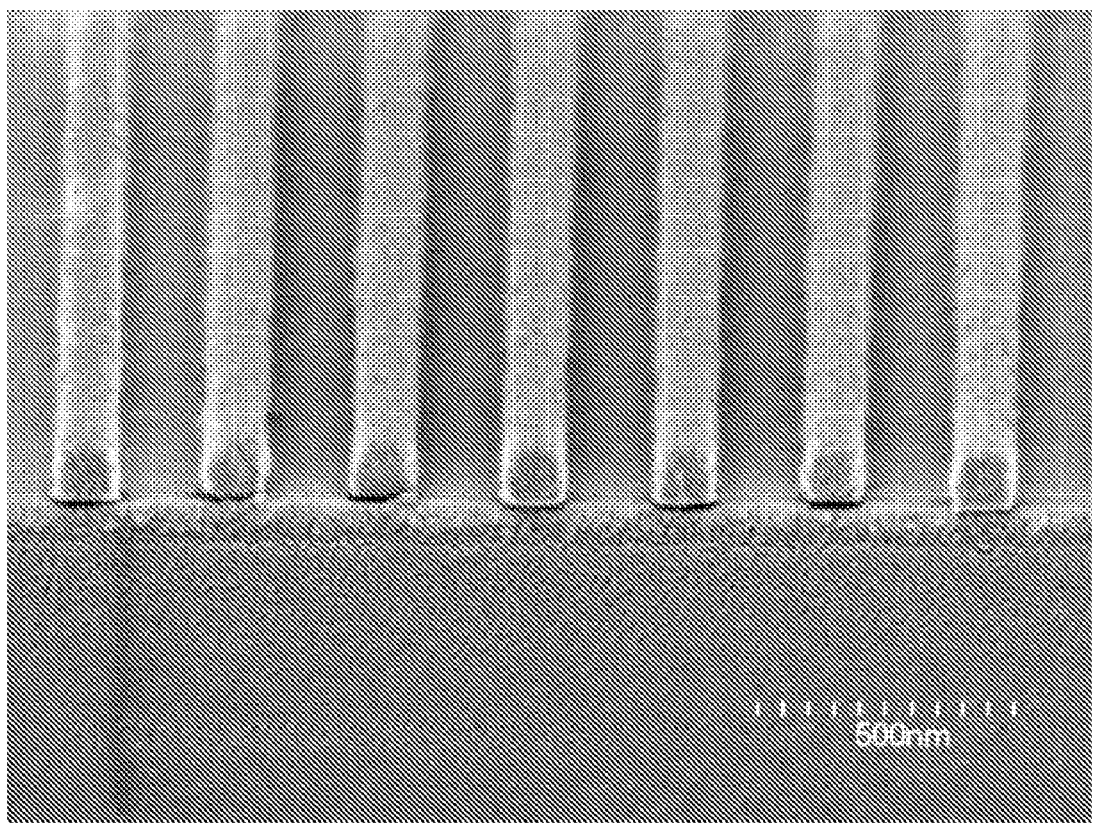
FIG. 8A is an electron micrograph of a bilayer photoresist pattern (120 nm 1:1.5 lines/spaces) formed in air without a topcoat, in accordance with the present invention.

FIG. 8A is an electron micrograph of a bilayer photoresist pattern (100 nm 1:1.5 lines/spaces) formed in air without a topcoat. A 130 nm thick layer of a bilayer 193 nm (exposure wavelength) photoresist was formed on a 5 inch silicon wafer. The wafer was post apply baked at 120° C. for 60 seconds. The wafer was then exposed in air through a 1.5:1 opaque to clear mask pattern at a wavelength of 193 nm and then post expose baked at 100° C. for 60 seconds. The wafer was subsequently developed for 60 seconds in 0.26 N TMAH.

Figure 8B:
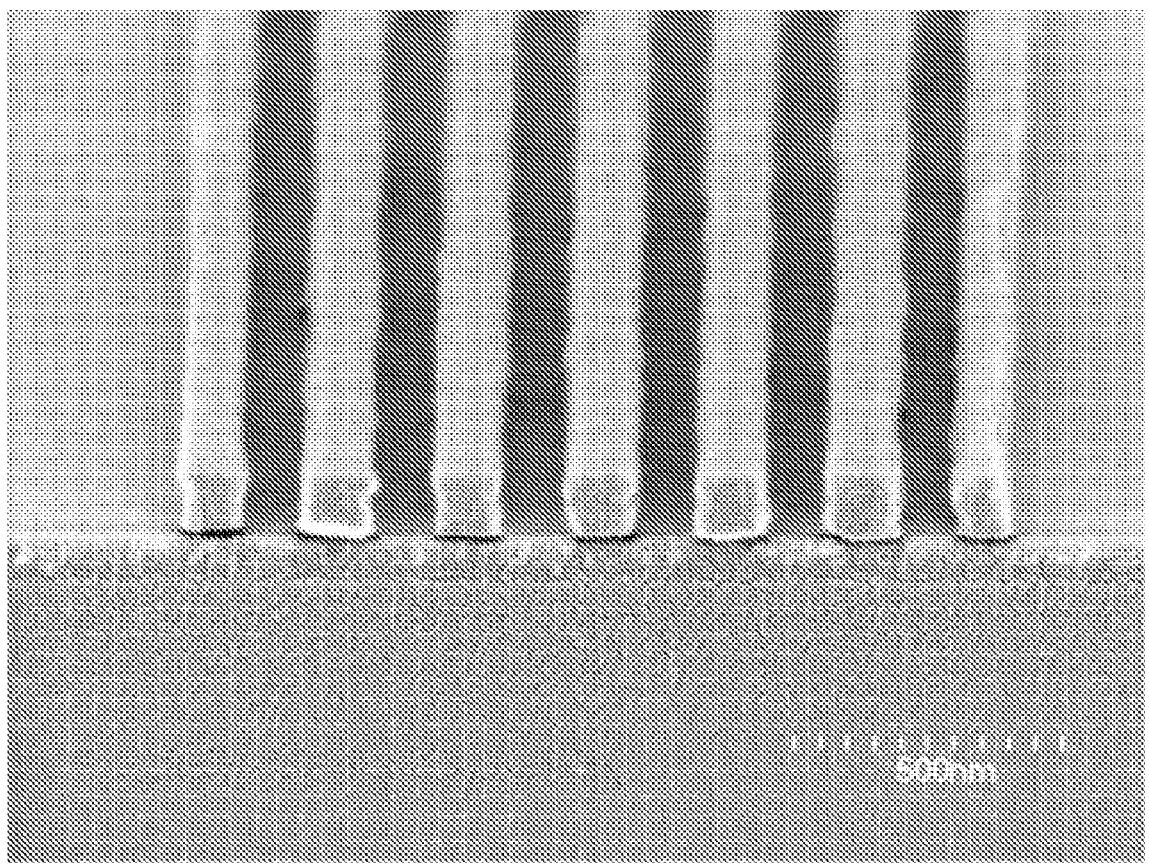
FIG. 8B is an electron micrograph of a bilayer photoresist pattern (100 nm 1:1.5 lines/spaces) formed in air with a topcoat material cast from OFP-TFEE, in accordance with the present invention.

FIG. 8B is an electron micrograph of a bilayer photoresist pattern (120 nm 1:1.5 lines/spaces) formed in air with a topcoat material cast from OFP-TFEE in an embodiment of the present invention. A 130 nm thick layer of a bilayer 193 nm (exposure wavelength) photoresist was formed on a 5 inch silicon wafer. The wafer was post apply baked at 120° C. for 60 seconds. A solution of the topcoat composition comprising the polymer (2) in OFP-TFEE was spin cast applied onto the photoresist layer and baked to form a topcoat covering the photoresist layer. The wafer was then exposed in air through a 1.5:1 opaque to clear mask pattern at a wavelength of 193 nm and then post expose baked at 100° C. for 60 seconds. The wafer was subsequently developed for 60 seconds in 0.26 N TMAH.

Comparing the electron micrograph of FIG. 8A to the electron micrograph of FIG. 8B illustrates that the photoresist image formed from the bilayer photoresist with a topcoat (FIG. 8B) is a much better image than the image formed from the bilayer photoresist without a topcoat (FIG. 8A), 100 nm vs 120 nm respectively. No degradation of the photoresist layer with a topcoat in FIG. 8B can bee seen.

While the topcoat compositions and the topcoat materials described to this point have been in the context of utility with single, bilayer, and trilayer photoresists, and utility within the photolithography process, the topcoat compositions and the topcoat materials of the present invention also have utility as a protective coating against environmental contamination from particulates, water vapor, and chemical vapors that could degrade the imaging process or cause imperfections in the photoresist images, and ultimately yield defects in the fabricated product.

The topcoat material substantially prevents out-gassing of molecules from the photoresist into the process medium used to form a photolithographic image on the photoresist and substantially prevents diffusion of substances from the process medium into the photoresist. The elimination of out-gassed molecules substantially prevents the contamination of the lens component used in the photolithographic process.

Further, the topcoat material substantially prevents leaching of photoresist components into the process medium used to from a photolithographic image on the photoresist. The elimination of leached photoresist components also substantially prevents the contamination of the lens component used in the photolithographic process.

The topcoat materials of the present invention have an added benefit in that they may be used as a top anti-reflection coating (ARC). Typically in the photolithographic process (see FIG. 1), a bottom ARC is formed on the top surface 188 of the photoresist wafer 190. In an embodiment of the present invention, the top ARC is formed on the top surface 196 of the photoresist layer 186.

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A method, comprising:
    forming a photoresist layer on a substrate;
    applying a topcoat composition on a top surface of said photoresist layer, said topcoat composition consisting of a casting solvent and
    a copolymer consisting of monomers having the structures:

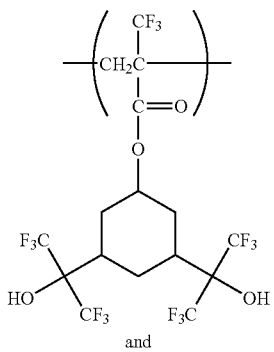

and

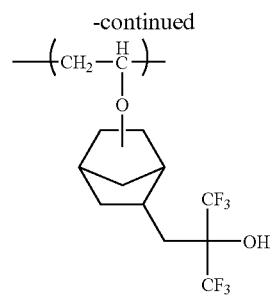

removing said casting solvent from said topcoat composition to form a topcoat layer on said top surface said photoresist layer;
    exposing said photoresist to radiation, said radiation changing a chemical composition of said regions of said photoresist exposed to said radiation, forming exposed and unexposed regions in said photoresist; and
    simultaneously (i) removing entirely said topcoat layer and (ii) removing said exposed regions of said photoresist or removing said unexposed regions of said photoresist.

2. The method of claim 1, wherein said simultaneously (i) removing entirely said topcoat layer and (ii) removing said exposed regions of said photoresist or removing said unexposed regions of said photoresist includes the use of an aqueous base.

3. The method of claim 2, wherein said aqueous base is selected from the group consisting of tetramethylammonium hydroxide, an akylammonium hydroxide, an arylammonium hydroxide, a Group (I) hydroxide, a Group (I) carbonate, and combinations thereof.

4. The method of claim 1, wherein said topcoat layer functions as a top anti-reflection coating.

5. The method of claim 1, wherein said applying said topcoat composition is selected from the group consisting of spin casting said topcoat composition, spraying said topcoat composition, dip coating said topcoat composition, and combinations thereof.

6. The method of claim 1,
    wherein said exposing said radiation is performed with a layer of immersion fluid on a top surface of said topcoat layer, and
    wherein said topcoat layer (i) substantially prevents outgassing of molecules from said photoresist into said immersion fluid, (ii) substantially prevents diffusion of substances from said immersion fluid into said photoresist layer, and (iii) substantially prevents leaching of photoresist components from said photoresist layer into said immersion fluid.

7. The method of claim 6, wherein said immersion fluid is a liquid.

8. The method of claim 6, wherein said immersion fluid is water.

9. The method of claim 1, further including:
    forming a immersion fluid layer on a top surface of said topcoat layer;
    placing a lens in physical contact with said immersion fluid layer, said radiation passing through said lens and said immersion fluid; and
    wherein said topcoat material inhibits leaching of photoresist components from said photoresist layer into said immersion fluid and then depositing from said immersion fluid on to a surface of said lens in contact with said immersion fluid and (ii) inhibits out-gassing of molecules from said photoresist layer into said immersion fluid.

10. The method of claim 9, wherein said immersion fluid is a liquid.

11. The method of claim 9, wherein said immersion fluid is water.

12. The method of claim 1, wherein said forming said photoresist layer on said substrate includes forming a first layer of photoresist on said substrate and forming a second layer of photoresist on a top surface of said first layer of photoresist.

13. The method of claim 1, wherein said copolymer consists of n mole percent of said monomer having the structure:

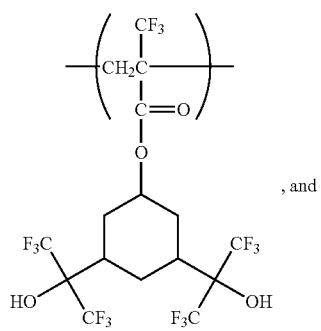

, and m mole percent of said monomer having the structure:

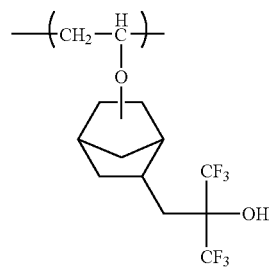

wherein n + m = 100%, n is about 50% to about 75%, m is about 50% to about 25%, and n is greater than m.

14. The method of claim 1, wherein said copolymer has a weight-average molecular weight in a range from about 3,000 g/mol to about 100,000 g/mol.

15. The method of claim 1, wherein said forming said photoresist layer on said substrate includes forming a first layer of photoresist on said substrate, forming a second layer of photoresist on a top surface of said first layer of photoresist and forming a third layer of photoresist on a top surface of said second layer of photoresist.

16. The method of claim 1, wherein said casting solvent is selected from the group consisting of α,α,α-trifluorotoluene, 2,2,3,3,4,4,5,5-octafluoropentyl-1,1,2,2-tetrafluoroethyl ether, a mixture of a decane and octanol, and combinations thereof.

17. The method of claim 1, wherein said casting solvent is non-polar.

* * * * *